(12) United States Patent
Rees et al.

(10) Patent No.: US 7,609,734 B2
(45) Date of Patent: Oct. 27, 2009

(54) SWITCHED GATE CURRENT DRIVER

(75) Inventors: Theodore D. Rees, Mountain View, CA (US); Anatoly Aranovsky, Los Gatos, CA (US)

(73) Assignee: Intersil Americas Inc., Milpitas, CA (US)

( * ) Notice: Subject to any disclaimer, the term of this patent is extended or adjusted under 35 U.S.C. 154(b) by 228 days.

(21) Appl. No.: 11/669,722

(22) Filed: Jan. 31, 2007

(65) Prior Publication Data

US 2007/0205810 A1    Sep. 6, 2007

Related U.S. Application Data

(60) Provisional application No. 60/777,961, filed on Mar. 1, 2006.

(51) Int. Cl.
*H01S 3/00* (2006.01)
(52) U.S. Cl. .............. 372/38.02; 372/29.012; 372/29.015; 372/38.07; 327/108
(58) Field of Classification Search ......... 372/29.012, 372/29.015, 38.1, 38.01–38.09; 327/108
See application file for complete search history.

(56) References Cited

U.S. PATENT DOCUMENTS

2005/0195869 A1 * 9/2005 Kubota .............. 372/38.02

* cited by examiner

*Primary Examiner*—Minsun Harvey
*Assistant Examiner*—Tod T Van Roy
(74) *Attorney, Agent, or Firm*—Fliesler Meyer LLP

(57) ABSTRACT

Embodiments of the present invention are directed to current driver circuits and methods for driving a load. The current driver circuit includes a first transistor (Q1) and a second transistor (Q2) each having a gate, a drain and a source. The drain of the second transistor (Q2) forms the output of the current driver circuit. The first and second transistors (Q1) and (Q2) function as a current mirror when the gates of the first and second transistors (Q1) and (Q2) are selectively connected together. The current driver circuit also includes a current source, a load mimic circuit, and a control loop (e.g., including an op-amp), which are configured to cause the voltage at the drain of the first transistor (Q1) to substantially equal the voltage at the output of the current driver circuit.

21 Claims, 13 Drawing Sheets

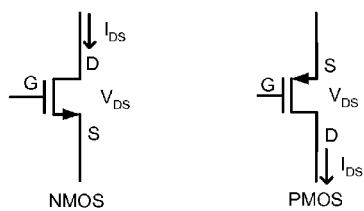

FIG. 1

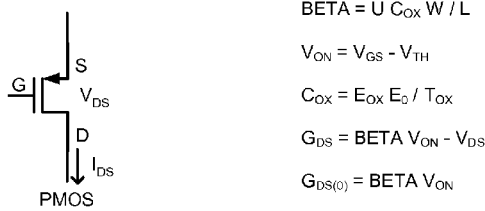

$I_{DS} = BETA (V_{ON} V_{DS} - V_{DS}^2 /2)$  For $0 < V_{DS} < V_{ON}$   (RESISTIVE MODE)

$I_{DS} = BETA\ V_{ON}^2/2$  For $V_{DS} > V_{ON}$   (CURRENT SOURCE MODE)

$BETA = U\ C_{OX}\ W / L$ $V_{ON} = V_{GS} - V_{TH}$ $C_{OX} = E_{OX} E_0 / T_{OX}$ $G_{DS} = BETA\ V_{ON} - V_{DS}$ $G_{DS(0)} = BETA\ V_{ON}$ $U = 0.044$ (CMOS)
$U = 0.012$ (NMOS)
$E_{OX} = 3.9$
$E_0 = 8.854e{-}12$
$V_{TH} = 0.5$

FIG. 2

NMOS:
Let: $T_{OX} = 14e{-}9$
Let: W/L = 1318
Then:
$C_{OX} = 0.00247$
$BETA_N = 0.143$
$I_{DS} = 0.143( V_{ON} V_{DS} - V_{DS}^2 /2)$   (RESISTIVE MODE)
$I_{DS} = 0.143 V_{ON} 2 /2$   (CURRENT SOURCE MODE)
$G_{DS(0)} = 0.143 V_{ON}$   (STARTING CONDUCTANCE)

PMOS:
Let: $T_{OX} = 14e{-}9$
Let: W/L = 4832
Then:
$C_{OX} = 0.00247$
$BETA_N = 0.143$
$I_{DS} = 0.143( V_{ON} V_{DS} - VDS\ 2 /2)$   (RESISTIVE MODE)
$I_{DS} = 0.143 V_{ON} 2 /2$   (CURRENT SOURCE MODE)
$G_{DS(0)} = 0.143 V_{ON}$   (STARTING CONDUCTANCE)

FIG. 3

SWITCHED GATE CURRENT DRIVER

PRIORITY CLAIM

This application claims priority under 35 U.S.C. 119(e) to U.S. Provisional Patent Application No. 60/777,961, filed Mar. 1, 2006, which is incorporated herein by reference.

FIELD OF THE INVENTION

The present invention relates to current drivers, and in specific embodiments, to current drivers that are used to drive laser diodes.

BACKGROUND

Current drivers are used to drive currents through a load, such as, but not limited to, a laser diode type load. Many current driver circuits, such as those shown in FIGS. 6 and 11, include metal oxide semiconductor (MOS) devices, also referred to as MOS transistors. Accordingly, it is useful to first review of the characteristics of MOS devices and laser diodes, in order to understand their impact on circuit topology.

In FIG. 1 is shown the symbol and nomenclature for a PMOS device (also known as a PMOS transistor) and an NMOS device (also known as an NMOS transistor). In FIG. 2 is shown simplified equations governing the relationships between the applied voltages and the supplied currents of MOS devices. In FIG. 3 is shown some arbitrarily sized NMOS and PMOS devices. This is a very simplified model, and in the real case there are many factors that modify the results. However, the modifications to the results are moderate, and the simplifications shown will not invalidate the discussion and comparisons below.

Simply expressed, a MOS device functions like a resistor if $V_{DS}$ is less than $V_{ON}$, (where $V_{ON}=V_{GS}-V_{th}$). But if $V_{DS}$ is greater than $V_{ON}$, (where $V_{ON}=V_{GS}-V_{th}$), the MOS device functions like a current source. The value of the resistor is inverse to $V_{ON}-V_{DS}$. The NMOS device can be smaller than the PMOS device for the same characteristics by the ratio of the mobility terms U, where the mobility is dependent on the semiconductor doping. The ratio of the gate width to the gate length can be varied by the designer to obtain devices of different size. Usually the gate length is the minimum allowable length, so it is the width that is increased to obtain a device capable of more current. In other words, relative sizes of MOS devices are typically descriptive of the gate width.

FIG. 4 is an exemplary graph showing the relationship between laser current and laser optical power output for a laser diode. FIG. 5 is an exemplary graph showing the relationship between current and laser voltage for a laser diode. It can be appreciated from FIG. 5 that for very low currents, the laser voltage increases rapidly with increasing laser current. Also, by the time the current is large enough to cause the laser diode to laser, the laser diode acts like a battery and a series resistor. Also shown in FIG. 5 is an exemplary VDD voltage for various circuits discussed below. The headroom voltage is the difference between VDD and the laser voltage.

FIG. 6 illustrates an exemplary current driver 602, according to the prior art, which shall be referred to as a current mirror current driver because of its use of a simple current mirror 604. The current mirror 604 includes transistors Q1 and Q2, which are connected in a common source configuration and a common gate configuration. The gate and the drain of transistor Q1 are connected together, to form the input of the current mirror 604, and the drain of transistor Q2 forms the output of the current mirror 604.

A control current source $I_{control}$ is connected between the input of the current mirror 604 and a voltage rail, which is shown as being ground (GND). A two level control signal is used to control the current source $I_{control}$, i.e., to turn the current source $I_{control}$ off and on (or from a first current level to a second current level). When the current source $I_{control}$ is turned on, the current produced by the current source is mirrored by the current mirror 604, such that a proportional current is produced at the output of the current mirror 604, i.e., at the drain of transistor Q2.

In this configuration, the output of the current mirror 604 is the output current (Iout) of the current driver 602. This output current Iout is shown as being used to drive a laser diode (LD), alone, or together with one or more other driver(s), which is/are represented by block 606. In other words, the output current Iout of the current mirror current driver 602 is added to current(s) produced by the other driver(s) 606, to thereby produce the total output current at the IOUT pin, which is used to drive the laser diode LD.

The current mirror current driver 602 is very simple, but suffers from a speed versus power consumption (i.e., efficiency) problem. More specifically, if the size of transistor Q1 is made equal to the size of transistor Q2, then the current mirror current driver 602 is fast. However, when the size of transistors Q1 and Q2 are equal, the output current flows not only to the load (LD in this example) from transistor Q2, but also a copy of the output current flows through transistor Q1, resulting in an efficiency of less than 50%. To make the efficiency higher, the size of transistor Q1 can be made much smaller than transistor Q2. However, when transistor Q1 is much smaller than transistor Q2, the applied control current $I_{control}$ must charge the sizeable capacitance seen at the gate of transistor Q2, causing the circuit to be slow. Accordingly, the current mirror current driver 602 can be fast or be efficient, but not both.

FIGS. 7-10 are used to shown the conduction characteristics for various MOS devices. In these FIGS. the variable D is a multiplier that is useful for making the plots. Also, in the legend of these FIGS, V is representative of $V_{ON}$.

In FIG. 7, there is shown the conduction of a small MOS device (beta=0.05) with a large $V_{ON}$. There is also shown a load line (ILOAD) from a high power laser diode. It can be seen that small currents can be obtained with $V_{ON}$ of less than 1V, and that the device is then in the current source mode of operation. But if $V_{ON}$ is further increased, the device moves to the resistive mode of operation. In this case, the laser current becomes a function of the supply voltage, laser voltage, laser resistance, and MOS device resistance. If the small MOS device of FIG. 7 were used in the current mirror current driver 602 of FIG. 6, the accuracy and predictability of the Iout current would be compromised, by the variations of the power supply, and the change in operation mode of the MOS device from current source mode to resistor mode. In addition, if other currents (e.g., from other drivers 606) were added to Iout, the voltage at the IOUT pin would increase and also effect the current through transistor Q2.

In FIG. 8, there is shown the conduction of a large MOS device with a small $V_{ON}$. The MOS device is 6 times larger (beta=0.3) than the MOS device of FIG. 7 (where beta was 0.05), but is able to achieve the same output current with only 1V of $V_{ON}$. The difference here is that the MOS device is nearly always in the current source mode of operation, and not as sensitive to the supply voltage changes. If the large MOS device of FIG. 8 were used in the current mirror current driver 602 of FIG. 6, as long as the voltage at the IOUT pin remains small enough, other currents (e.g., from other drivers 606) can be added to Iout without significantly changing the current through transistor Q2. This would be the typical sizing of MOS devices for the current mirror current driver 602 of FIG. 6.

In FIG. 9, there is shown the MOS device of FIG. 7, but with the load line of a 2.9 ohm resistor to ground. Here it can be seen that the maximum current is limited by the resistor. It can also be seen that the maximum current is limited by the MOS device to about 2.5 amps.

In FIG. 10, there is shown the MOS device of FIG. 8, but with the load line of a 2.9 ohm resistor to ground. Here it can be seen that this MOS device can supply more current than the MOS device of FIG. 7, but to do so it must have it's $V_{ON}$ raised to about 2V. Again the current is limited by the resistor. This MOS device could have a very large output current if the output current were shorted and $V_{ON}$ was raised to about 5V.

Referring to FIGS. 9 and 10, it is not surprising that a larger MOS device can supply more current than a smaller MOS device to the same resistor. But, given that the large MOS device is 6 times larger than the small MOS device, the increase in current is not that significant with the normal resistive load. This suggests that from the standpoint of limiting Iout under abnormal conditions, the smaller MOS device with higher $V_{ON}$ is better, although there is more power per unit area dissipated in the smaller device.

Returning to FIG. 6, it can be seen that as the headroom voltage ($V_{DS}$ in FIG. 1) decreases due to increasing output voltage, the $V_{ON}$ of transistor Q2 must decrease for transistor Q2 to remain in the current source mode of operation. To do so, the size of transistor Q2 must be made larger as the maximum applied output voltage increases. This has the problem of increasing the size of the capacitance of transistor Q2, which will tend to slow down the circuit. Thus, the decreasing headroom has a very high price to pay in terms of MOS device size and circuit speed, if transistor Q2 is to remain in the current source mode of operation.

The current mirror type of laser driver of FIG. 6 was replaced with a faster circuit as CD writers gave way to faster DVD writers. But, it can still be used to provide a read current where there is not a high speed requirement. Accordingly, in order to obtain speed and simple control, a cascode configuration current driver 1102 is often used, as shown in FIG. 11.

Referring to FIG. 11, the cascode switched current driver 1102 includes a pair of transistors Q1 and Q2 that act like a current mirror, with the control current source $I_{control}$ still being connected between the input of the current mirror and GND. Also included in the driver 1102 are transistors Q3 and Q4, which in this arrangement functions as resistors. More specifically, because the gate of transistor Q3 is connected to GND, $V_{GS}$ and $V_{ON}$ of transistor Q3 is very large, and $V_{DS}$ of transistor Q3 is very small, causing transistor Q3 to operate in resistor mode. The gate of transistor Q4 is connected to the output of an inverter U4. When the output of the inverter U4 is low (i.e., the input to the inverter is high), the transistor Q4 is on and acts as a small resistor, and depending on the bias determined by the control current and transistor Q1, results in a large current flow through transistor Q2. When the output of the inverter U4 is high (i.e., the input to the inverter is low), the transistor Q4 is turned off and as a result no current can flow through transistor Q2.

In the cascode switched current driver 1102 of FIG. 11, the speed can be increased and the circuit can have high efficiency, but the sizes of transistors Q2 and Q4 become problematic. This is because transistor Q4 uses up some of the headroom voltage. It is as if the VDD has decreased due to the presence of transistor Q4 and the voltage drop on transistor Q4. This reduces the headroom available to transistor Q2, requiring that it's $V_{ON}$ must be made smaller, and that transistor Q2 must then be made larger to compensate. So although the cascode switched current driver 1102 can be fast and efficient, it suffers from larger sized MOS devices that must operate with reduced headroom and $V_{ON}$. This increased size increases the output capacitance, causing the circuit to slow-down. Additionally, because of the low headroom, the voltage available to drive the parasitic inductance between transistor Q2 and the laser diode (LD) is decreased, thereby further decreases the speed of operation. Further, since $V_{ON}$ is small to keep transistor Q2 in a current mode, the circuit becomes sensitive to noise on the gate voltage of transistor Q2. This is also a problem for the simple current mirror of FIG. 6 when the headroom is small.

Accordingly, there is still a desire to provide a current driver that can operate at low headroom, using smaller devices with low capacitance, and preferably with reduced susceptibility to noise.

SUMMARY

Embodiments of the present invention are directed to current driver circuits and methods for driving a load. In accordance with an embodiment, a current driver circuit includes first and second transistors (Q1) and (Q2), a load mimic circuit (1308), a control current source, and a control loop. The transistors (Q1) and (Q2) are configured to function as a current mirror when their gates are selectively connected together, with a drain of the first transistor (Q1) forming an input of the current mirror, a drain of the second transistor (Q2) forming an output of the current mirror, and the drain of the second transistor (Q2) also forming the output of the current driver circuit. The current source provides a control current, which flows through the load mimic circuit (1308). This enables the load mimic circuit to provides a voltage approximately equal the voltage at the output of the current driver circuit, when an output current (Iout) provided at the output of the current driver circuit is driving the load (LD). The control loop uses the load mimic circuit (1308) to cause the voltage at the drain of the first transistor (Q1) to approximately equal the voltage at the output of the current driver circuit, when the output current (Iout) provided at the output of the current driver circuit is driving the load (LD).

In accordance with an embodiment, each transistor includes a channel length and a channel width, with the channel lengths of the first and second transistors (Q1) and (Q2) being substantially the same, and the channel width of the first transistor (Q1) being less than the channel width of the second transistor (Q2). This results in a source-drain current of the first transistor (Q1) being less than a source drain current of the second transistor (Q2), which provides for good efficiency.

In accordance with a specific embodiment, the load (LD) being driven is connected between the output of the current driver circuit and a first voltage rail (e.g., GND). Sources of the first and second transistors (Q1) and (Q2) are connected to a second voltage rail (e.g., VDD). The current source and the load mimic circuit (1308) are connected in series between the first voltage rail (e.g., GND) and the second voltage rail (e.g., VDD). Additionally, the current driver circuit includes an op-amp (U) including first and second inputs and an output. The load mimic circuit (1308) includes a first terminal, a second terminal, and a voltage source (B1) connected in series with a resistor (R) between the first and second terminals. A voltage between the first and second terminals of the load mimic circuit (1308) is similar to a voltage across the load (LD) when an output current (Iout) of the current driver circuit is driving the load (LD). The op-amp (U) and the load mimic circuit (1308) are configured to cause the voltage at the drain of the transistor (Q1) to substantially equal the voltage at the output of the current driver circuit.

In accordance with an embodiment, one of the inputs of the op-amp (U) is connected to a node between the current source (Icontrol) and the load mimic circuit (1308), so that a voltage at the one of the inputs of the op-amp (U) is substantially equal to the voltage across the load (LD). The other input of the op-amp (U) is connected to the drain of the first transistor (Q1). Additionally, the output of the op-amp (U) is connected to the gate of the first transistor (Q1).

In accordance with an embodiment, the current driver circuit further includes a second resistor (R2) connected between one of the inputs of the op-amp (U) and a node between the voltage source (B1) and the resistor (R) of the load mimic circuit (1308).

In accordance with an embodiment, a third transistor (Q6) selectively connects the gates of the first and second transistors (Q1) and (Q2) together. Additionally, a fourth transistor (Q5) selectively connects the gate of the second transistor (Q2) to the second voltage rail (e.g., VDD) when the third transistor (Q6) is not connecting the gates of the first and second transistors (Q1) and (Q2) together.

In accordance with an embodiment, the first transistor (Q1), the third transistor (Q6), the current source (Icontrol), the op-amp (U), the second resistor (R2) and the load mimic circuit (1308) make up a first gate voltage circuit that selectively provides a first voltage to the gate of the second transistor (Q2). The current driver circuit outputs a first current when the first voltage is provided to the gate of the second transistor (Q2).

In accordance with an embodiment, the current driver circuit also includes a second gate voltage circuit that selectively provides a second voltage to the gate of the second transistor (Q2), where the second voltage is different than the first voltage. The current driver circuit outputs a second current when the second voltage is provided to the gate of the second transistor (Q2), wherein the second current is different than the first current. In accordance with an embodiment, the first and second gate voltage circuits share at least a portion of the same load mimic circuit (1308). More specifically, the first and second gate voltage circuits can share the same voltage source (B1). Additional gate voltage circuits can also be provided, if desired, to produce other possible current outputs that can be used to drive the load (LD).

Further embodiments, and the features, aspects, and advantages of the present invention will become more apparent from the detailed description set forth below, the drawings and the claims.

BRIEF DESCRIPTION OF THE DRAWINGS

FIG. 1 illustrates conventional symbols and nomenclature for PMOS and NMOS transistors.

FIG. 2 shows simplified equations governing the relationships between the applied voltages and the supplied currents for PMOS and NMOS transistors.

FIG. 3 describes exemplary sizes of NMOS and PMOS transistors.

In FIG. 7 the MOS device is small (beta=0.05), and $V_{ON}$ ranges from 0 to 5.5V.

In FIG. 8 the MOS device is large, and $V_{ON}$ ranges from 0 to 1.1V.

FIG. 9 corresponds to the MOS device of FIG. 7, but with the load line of a 2.9 ohm resistor to ground.

FIG. 10 corresponds to the MOS device of FIG. 8, but with the load line of a 2.9 ohm resistor to ground.

DETAILED DESCRIPTION

Figure 12:
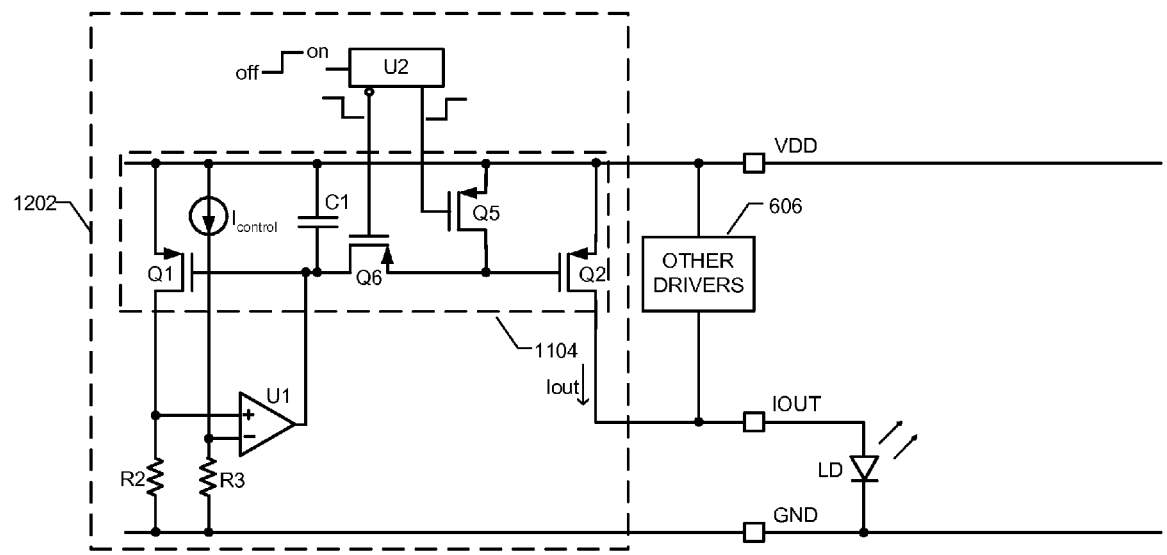
FIG. 12 is a circuit diagram including a current mode switched gate current driver, according to an embodiment of the present invention.

FIG. 12 illustrates a current mode switched gate current driver 1202, according to an embodiment of the present invention. As with the previous described current drivers, transistors Q1 and Q2 function generally as a current mirror. However, in this embodiment, transistors Q5 and Q6 are used to switch the voltage at the gate of transistor Q2 to the voltage established at the gate of transistor Q1, or to VDD. When the voltage at the gate of transistor Q2 is the same as the voltage at the gate of transistor Q1, then transistor Q1 is turned on and transistors Q1 and Q2 will function as a current mirror. However, when the voltage at the gate of transistor Q2 is VDD, then transistor Q2 will be turned off, and there will be substantially no current at the drain of transistor Q2.

In this embodiment the size of transistor Q2 is preferably large enough so that transistor Q2 operates as a current source. This means that the $V_{ON}$ should be small when the headroom voltage is small. It is believed that this circuit will perform better than the cascode switched current driver 1102, because MOS device transistor Q2 does not share the headroom voltage with another device. Thus the MOS device (i.e., transistor Q2) could be smaller, the output capacitance smaller, the ability to operate at reduced headroom improved, and noise immunity is improved. In addition, because the MOS device (i.e., transistor Q2) is operating in current mode, multiple driver channels (i.e., other drivers 606) can be added to the output with minimal complication, so long as the headroom voltage remains sufficient.

Figure 6:
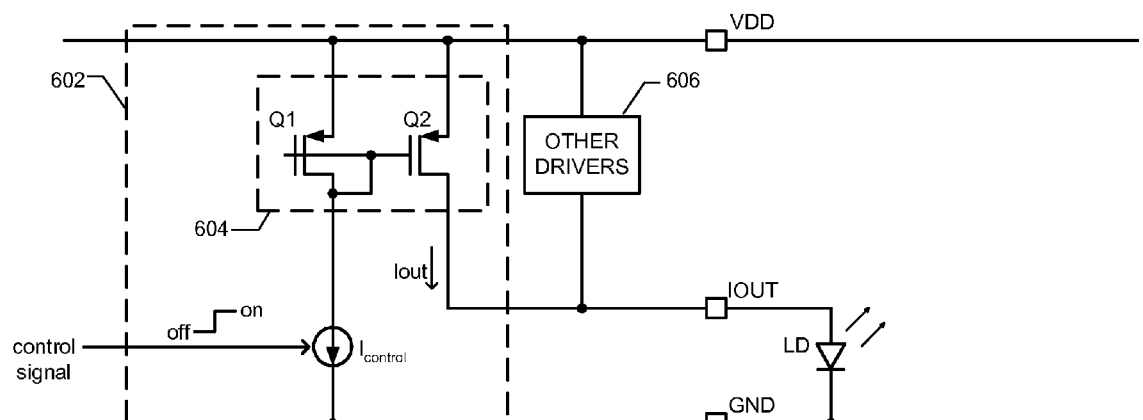
FIG. 6 is a circuit diagram including a current mirror current driver, according to the prior art.
Figure 7:
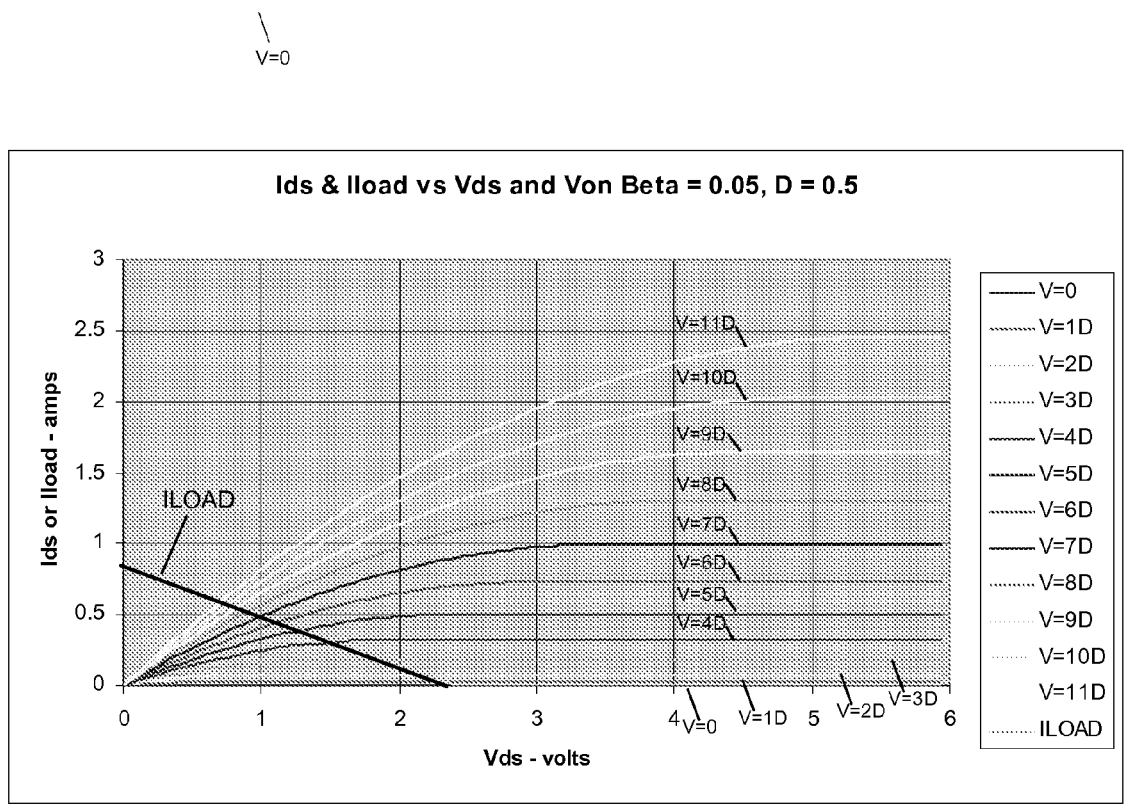
FIGS. 7-10 are graphs that are useful for illustrating the conduction characteristics of different sized MOS devices, with different values for $V_{ON}$.
Figure 8:
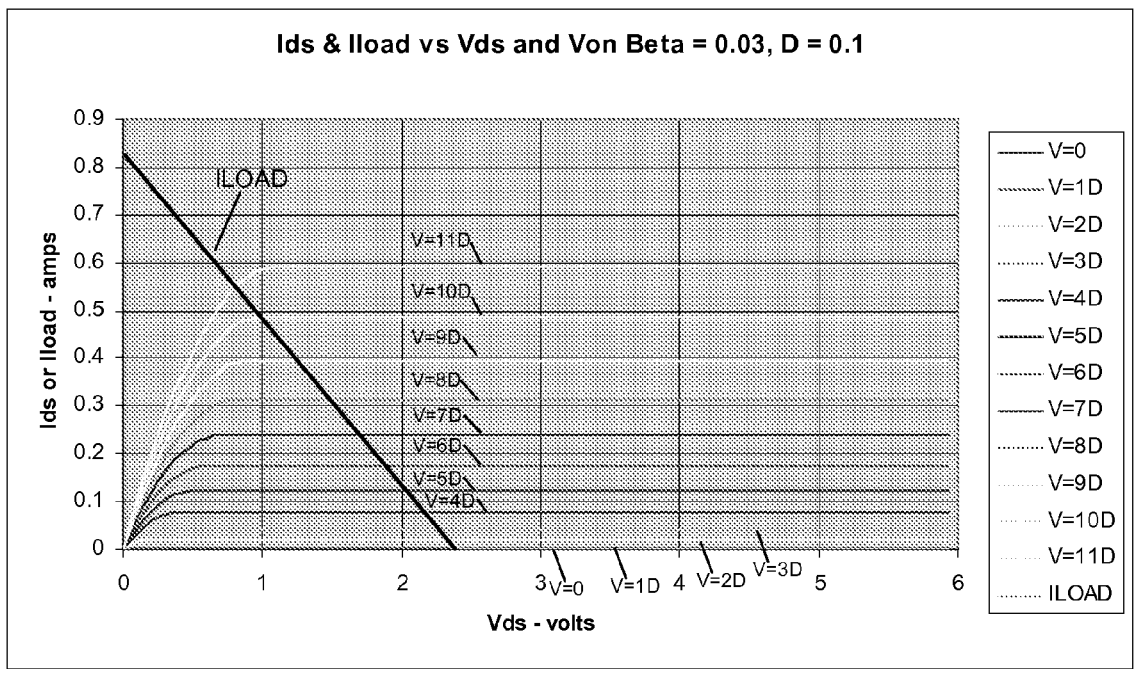
Figure 9:
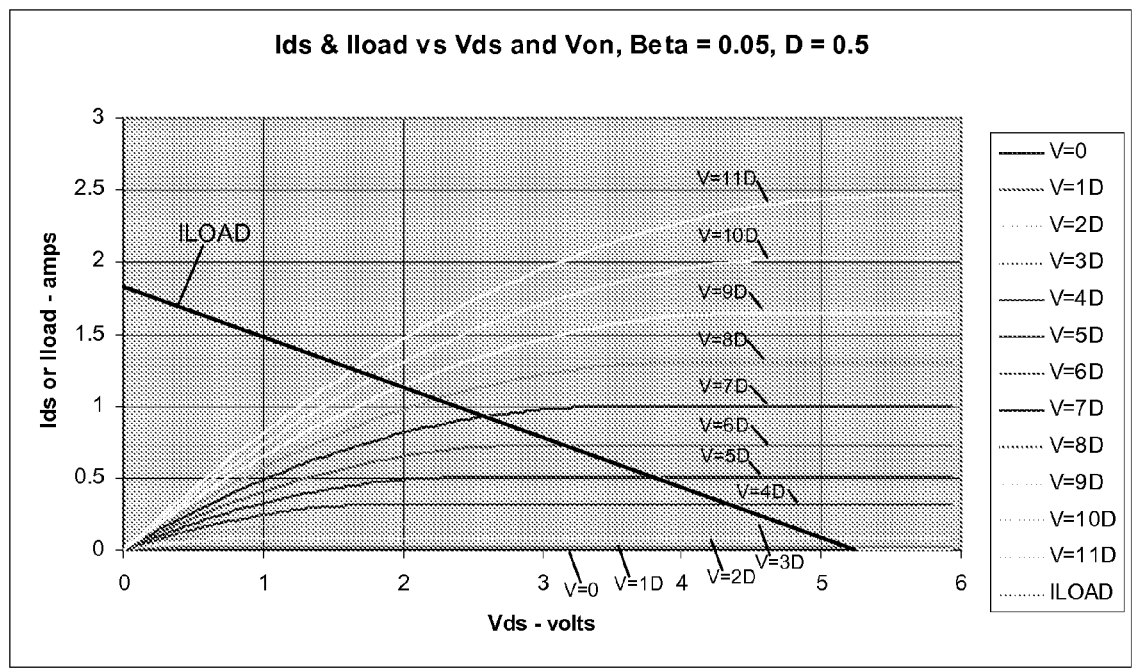
Figure 10:
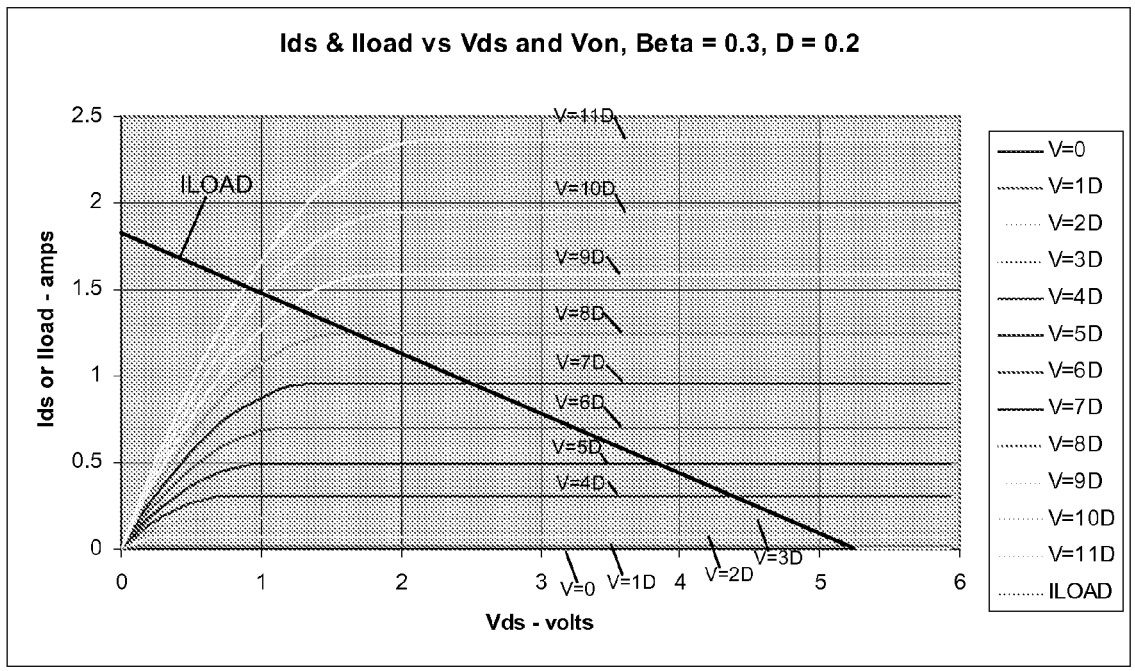
Figure 11:
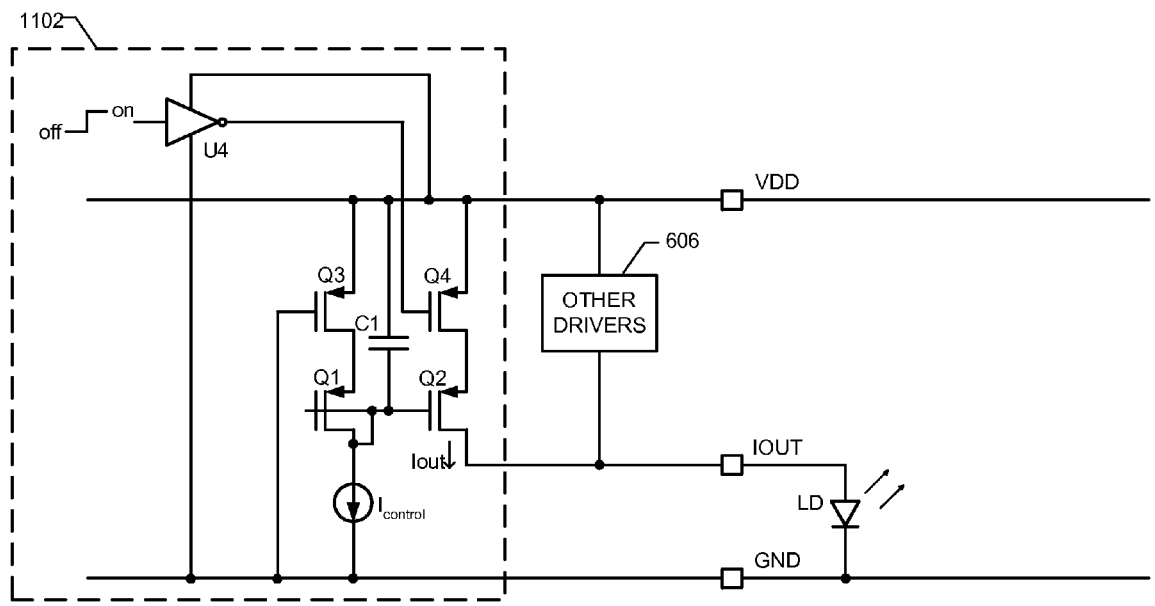
FIG. 11 is a circuit diagram including a cascode switched current driver, according to the prior art.

More specifically, transistors Q5 and Q6 and control circuit U2 are added to improve the speed at which transistor Q2 can change current, compared to the simple current mirror configuration of FIG. 6. Referring back to FIG. 6, the control current $I_{control}$ must charge the gate of transistor Q2, and the combination of small control current and large capacitance on the gate of transistor Q2 makes the driver 602 slow. In contrast, in FIG. 12, transistor Q6 will move the gate voltage of transistor Q2 to the gate voltage of transistor Q1 quickly, and transistor Q5 will move the gate voltage of transistor Q2 to VDD quickly. Only one of transistors Q5 and Q6 are on at one time, thereby controlling whether the gate of transistor Q2 is at VDD or at the gate voltage of transistor Q1.

Control circuit U2 is a circuit that converts an input off/on signal to complementary off/on signals that drive the gates of transistors Q5 and Q6. The precise timing of the signal driving the gates of transistors Q5 and Q6 should be produced so that both the gate voltages Q5 and Q6 are not simultaneously turned on, which would disturb the gate voltage of transistor Q1. Control circuit U2 can include, for example, a differential transistor pair feeding a NAND latch, arranged such that the gate of only one of transistors Q5 and Q6 is below threshold at one time. One of ordinary skill in the art would appreciate that other configurations can be used to produce control circuit U2. When the input to the control circuit U2 is high, the gate of PMOS transistor Q6 is low (turning it on), and the gate of PMOS transistor Q5 is high (turning it off), which causes transistors Q1 and Q2 to generally act like a current mirror, as described in more detail below. When the input to controller U2 is low, the gate of PMOS transistor Q6 is high (turning it off), and the gate of PMOS transistor Q5 is low (turning it on), which causes the voltage at the drain of transistor Q5 (and thus at the gate of transistor Q2) to approach VDD. This turns transistor Q2 off, resulting in generally no current at the drain of transistor Q2 (i.e., Iout is substantially zero).

The control current $I_{control}$ flows through a resistor R3, thereby producing a voltage ($V_{control}$) at the inverting (−) input of an op-amp U1. In other words, because the control current $I_{control}$ defines the voltage drop across resistor R3, the control current $I_{control}$ establishes a control voltage at the inverting (−) input of op-amp U1. The current through transistor Q1 will define the voltage drop across a resistor R2, and thus the voltage at the non-inverting (+) input of op-amp U1. When the output of op-amp U1 goes down, the gate voltage of transistor Q1 goes down, and transistor Q1 conducts more (i.e., turns on more). This raises the voltage across resistor R2, thereby raising the voltage at the non-inverting (+) input of op-amp U1, which then raises the output voltage of op-amp U1, thereby turning off transistor Q1, in essence producing a negative feedback loop. This negative feedback loop regulates the voltage on the gate of transistor Q1, such that the current flowing through Q1 would be equal to the current flowing through resistor R3, if R2 was equal to R3. Capacitor C1 forms the dominant pole of the negative feedback loop, and also serves to absorb transient charge from the switching of transistor Q6. Op-amp U1 would have a current output since it drives a capacitor. It is also possible to use a voltage output op-amp U1, which would eliminate the need for capacitor C1.

If resistor R2 is half the resistance of R3, then the current through Q1 would be twice the current through R3. In other words, in this loop the relationship between the current through transistor Q1 and the control current $I_{control}$ is determined by the values of resistors R2 and R3. Further, even though resistors R2 and R3 can have different values of resistance, the voltage drops across resistors R2 and R3 will be essentially equal, due to the negative feedback loop. Thus the current across transistor Q1 equals $I_{control}$·R3/R2. The output current of the driver 1202 depends on the ratio of the size of transistor Q2 to the size of transistor Q1 (referred to as Q2/Q1), so that the output current Iout=Q2/Q1·R3/R2·$I_{control}$.

Figure 13A:
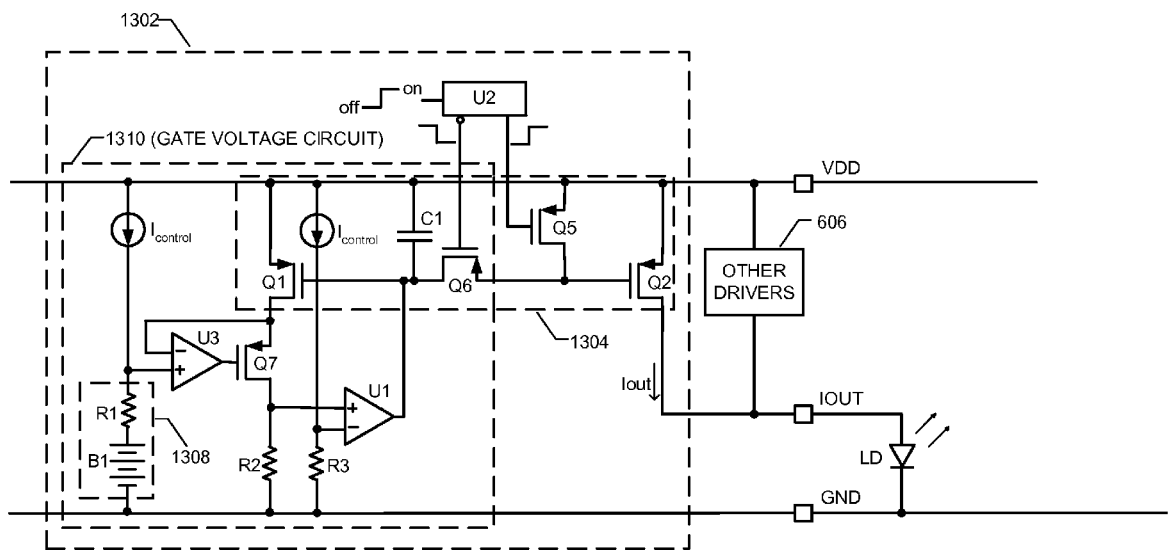
FIG. 13A is a circuit diagram including a resistive mode switched gate current driver, according to an embodiment of the present invention.

FIG. 13A illustrates a resistive mode switched gate current driver 1302, according to an embodiment of the present invention. As in FIG. 12, transistors Q1 and Q2 function generally as a current mirror, with the gate of transistor Q2 being switched to the voltage established at the gate of transistor Q1, or to VDD. However, in FIG. 12, the biasing control circuitry allows transistors Q1 and Q2 to operate in the restive mode. This is beneficial due to the decreased device size, decreased device capacitance, increased ability to operate at low headroom, and increased noise immunity. It is also possible to use this added bias circuit even if the devices are in current mode simply to improve the accuracy of the circuit. This is mentioned because even in current mode, the transistors still have some resistance.

The circuit of FIG. 13A is similar to the circuit of FIG. 12, but with the addition of voltage source B1, resistor R1, op-amp U3, transistor Q7, and a duplicate control current $I_{control}$ feeding resistor R1. The added circuitry enables the circuit to operate with transistors Q1 and Q2 in the beneficial resistive mode. When in the resistive mode, the drain voltage of transistor Q1 should be equal to the drain voltage of transistor Q2 in order to obtain the fixed relationship of currents through transistors Q1 and Q2. To do this, a copy of the control current is applied to voltage source B1 and resistor R1.

Figure 4:
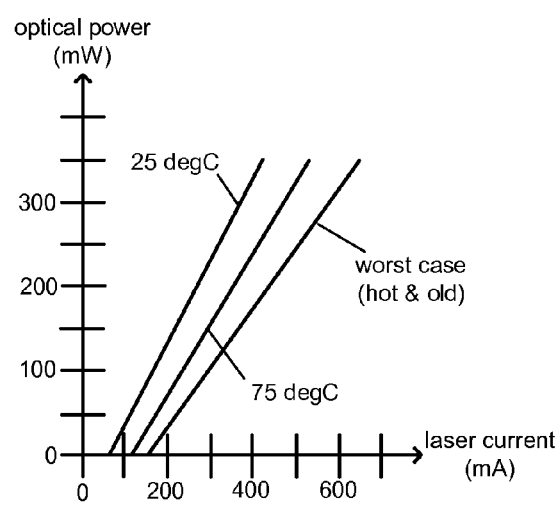
FIG. 4 is an exemplary graph showing the relationship between laser current and laser optical power output for a laser diode.
Figure 5:
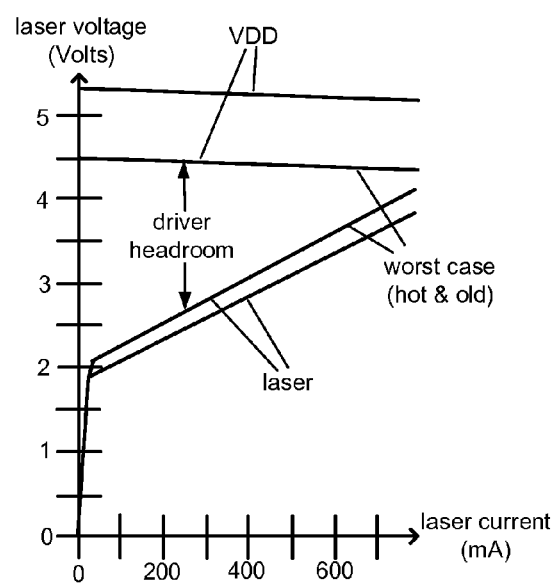
FIG. 5 is an exemplary graph showing the relationship between laser current and laser voltage for a laser diode.

The voltage source B1 mimics the laser diode when the laser diode has a small amount of current flowing through it. For example, referring back to FIG. 5, voltage source B1 can be about 2V, which corresponds to the point where about 5 mA are flowing through the laser diode. The resistor R1 mimics the resistance of the laser diode, which can be determined from the slope of the generally linear portion of the curve in FIG. 5, i.e., the laser diode resistance equals the change in voltage over the change in current. This is not to say that the value of resistor R1 is to equal the laser diode resistance. Rather, resistor R1 can be bigger than the laser diode resistance, so long as it is proportionally bigger in the same way that the current through transistor Q1 is proportionally smaller than the current through transistor Q2.

Because of its function, resistor R1 and voltage source B1 can be referred to as a laser model, or a laser diode mimic circuit 1308, which mimics the laser diode LD, but at a much lower current than the actual laser diode (LD). This is beneficial because it makes the circuit more efficient, by allowing the control current $I_{control}$ to be much smaller than the current desired at the drain of transistor Q2, which drives the laser diode LD. For example, $I_{control}$ can be 25 times smaller than the desired drive current Iout produced at the drain of transistor Q2, i.e., $I_{control}$ can be 20 mA while the output current Iout at the drain of transistor Q2 is 500 mA. So the control current $I_{control}$ can be set to produce the desired drive current Iout. If a load other than a laser diode is being driven by the current driver circuit, then the circuit 1308 should mimic that load. According, the circuit 1308 can be more generally referred to as a load mimic circuit.

As mentioned above, when the driver is used to drive a laser diode (LD) load, voltage source B1 and resistor R1 should mimic the laser diode (LD). Referring again to FIG. 5, it can be seen that the relationship of laser voltage to laser current can be approximated with a battery (about 2V in this case), and a resistor (about 2.8 ohm in this case). As can be appreciated from the description of FIG. 12, $I_{control}$=R2·Iout·Q1/(Q2·R3). And Iout·RL=$I_{control}$·R1. So R1=RL·Q2·R3/(Q1·R2), and B1=the laser voltage (about 2V in this case).

Referring to FIG. 13A, the op-amp U3 and transistor Q7 form a voltage follower circuit in that the op-amp U3 and transistor Q7 present the voltage drop across the laser diode mimic circuit 1308 to the drain of transistor Q1. Op-amp U3 and transistor Q7 work as follows to transfer the voltage across the laser diode mimic circuit 1308 to the drain of transistor Q1. When the voltage at the non-inverting (+) input of op-amp U3 increases, the output of op-amp U3 increases.

This raises the gate voltage of transistor Q7 and turns transistor Q7 off. This raises the voltage on the source of transistor Q7 due to the current from the drain of transistor Q1. This increased the drain voltage of transistor Q1, which is provided to the inverting (−) input of op-amp U3, which pushes the output of op-amp U3 down, and the gate voltage of transistor Q7 down. Thus the negative feedback loop reaches equilibrium when the two inputs of op-amp U3 are equal in voltage.

Since transistor Q1 is a fraction of the size of transistor Q2, and the voltage at the drain of transistor Q1 is the same as the voltage at the drain of transistor Q2, then transistor Q1 will conduct proportional to transistor Q2, according to their size ratio. So when transistor Q2 is turned on, the drive current (Iout) produced at the drain of transistor Q2 is a multiple of the current at the drain of transistor Q1, as defined by the size ratio of the two transistors. Also, when transistor Q2 is turned on, the voltage at the IOUT pin is equal to the voltage across the laser diode mimic circuit 1308, thereby enabling the amount of current flowing through transistor Q2 to be known, even though transistor Q2 is functioning in the resistive mode.

The circuit of FIG. 13A allows one current level to be established in the resistive mode. This is because the circuit of FIG. 13A, and more specifically the gate voltage circuit 1310 in FIG. 13A, produces only one voltage level (besides zero) at the gate of transistor Q2. It is also noted that the circuit of FIG. 13A can be used in current mode, and will improve the accuracy over the circuit of FIG. 12. The circuit of FIG. 14 below allows multiple different current levels to be established in the resistive mode, thereby enabling many current levels to be provided to the laser diode (LD) in a controlled manner.

Figure 13B:
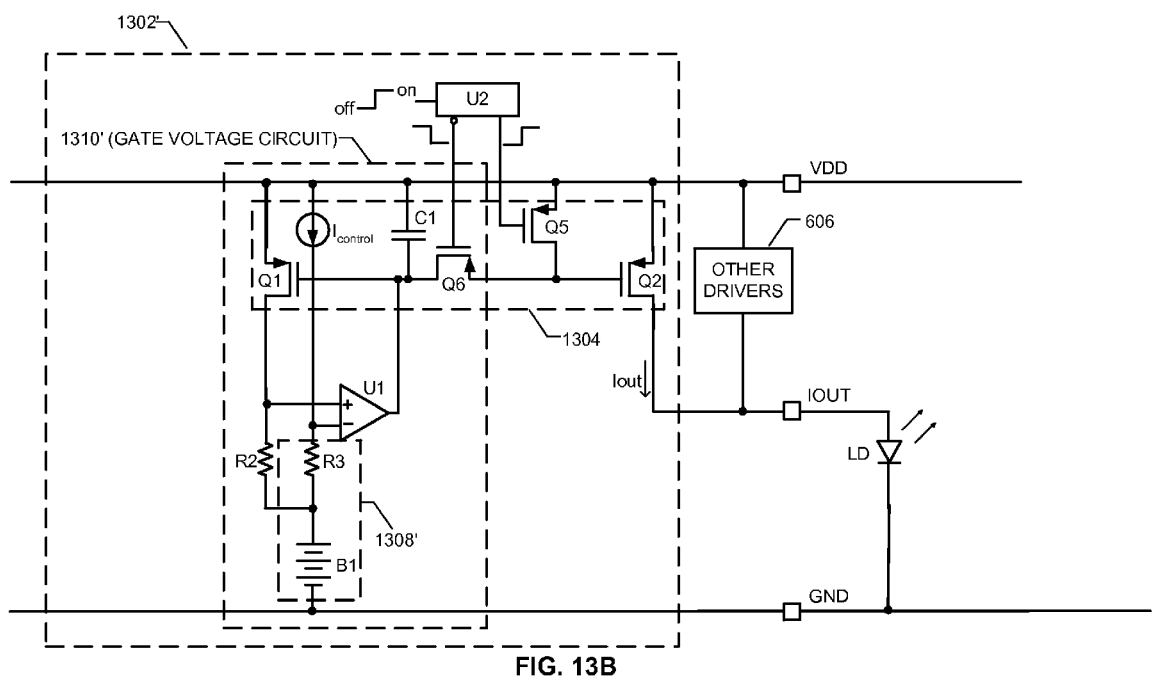
FIG. 13B is a circuit diagram including a resistive mode switched gate current driver, according to an alternative embodiment of the present invention.

FIG. 13B is similar to the circuit of FIG. 13A, except that transistor Q7, resistor R1 and op-amp U3 are eliminated, as is one of the current sources that produces Icontrol. This results in a simpler, smaller and less expensive gate voltage circuit 1310', and thus also a simpler, smaller and less expensive resistive mode switched gate current driver 1302'. In this embodiment, the resistor R3 and the voltage source B1 act as the laser diode mimic circuit 1308', which mimics the laser diode LD, but at a much lower current than the actual laser diode (LD).

In FIGS. 13A and 13B, the transistors Q1 and Q2 are configured to function as a current mirror when their gates are selectively connected together, with a drain of the first transistor Q1 forming an input of the current mirror, a drain of the second transistor Q2 forming an output of the current mirror, and the drain of the second transistor Q2 also forming the output of the current driver circuit 1302/1302'. The load mimic circuit 1308 provides a voltage approximately equal to the voltage at the output of the current driver circuit, when the control current (provided by the current source Icontrol) flows through the load mimic circuit 1308. A control loop uses the load mimic circuit 1308 to cause the voltage at the drain of the transistor Q1 to substantially equal the voltage at the output of the current driver circuit, when an output current (Iout) provided at the output of the current driver circuit is driving the load LD. In the above manner, embodiments of the present invention advantageously cause the voltage at the drain of the first transistor Q1 to approximately equal the voltage at the output of the current driver circuit, when the output current (Iout) provided at the output of the current driver circuit is driving the load LD. This is useful because CMOS transistors are imperfect devices, which can act like a resistor that is variable depending on the Vgs, and Vds. Only when Vgs and Vds match do the currents in Q1 and Q2 properly ratio according to their widths.

While the control loop in FIG. 13B is somewhat simpler than the control loop of FIG. 13A, either will work. One of ordinary skill in the art would also understand, based on the description herein, that alternative control loops are also possible, and within the scope of the present invention.

Figure 14A:
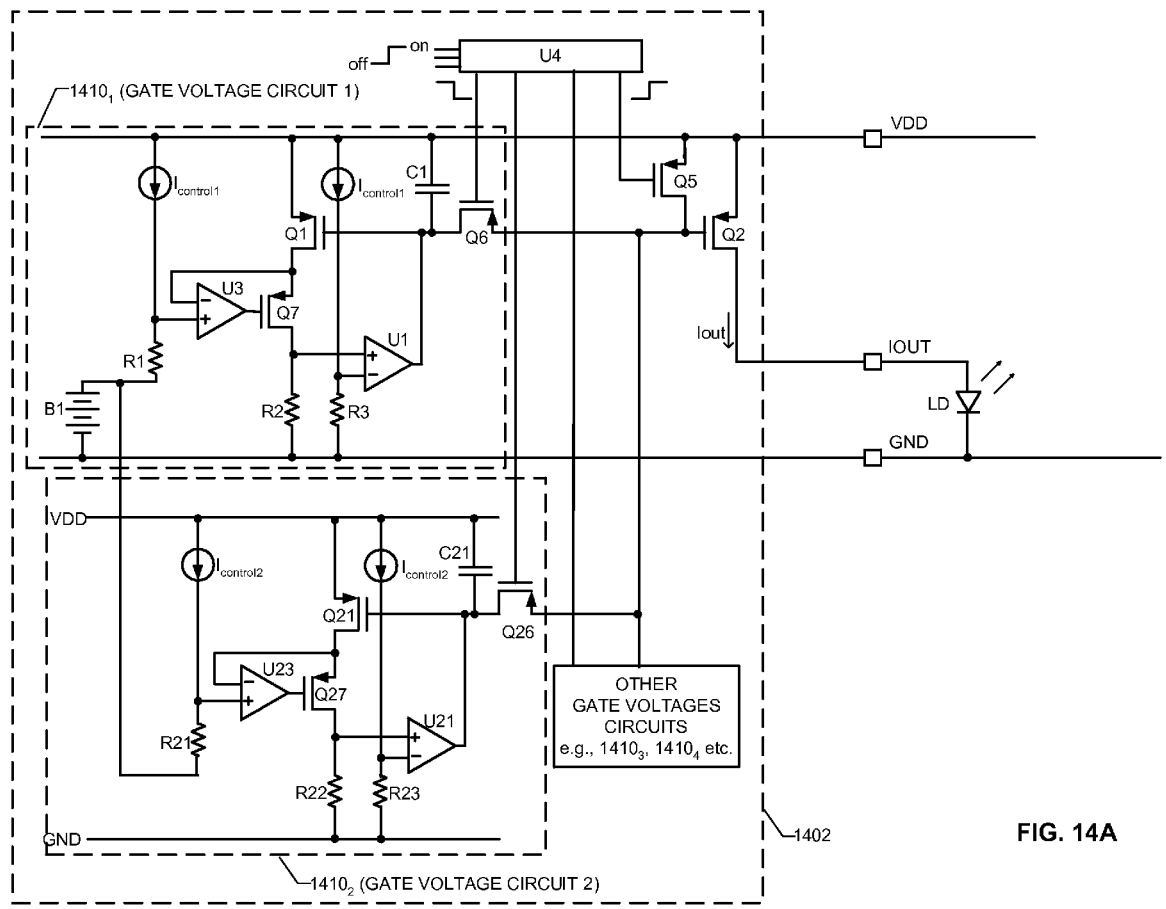
FIG. 14A is a circuit diagram including a multiple set point switched gate current driver, according to an embodiment of the present invention.

Referring now to FIG. 14A, there is shown a multi-set point switched gate current driver 1402, similar to the circuit in FIG. 13A, but with multiple gate voltages available to transistor Q2. In accordance with this embodiment, instead of having other drivers 606, transistor Q2 is used to provide multiple different currents. As shown in FIG. 14, a controller U4 has multiple input lines, and multiple output lines that are attached to gates of transistors Q6, Q26, (as well as further transistors, e.g., Q36, Q46, etc. not shown), which are acting as gate voltage switches, plus a gate line for the off voltage of transistor Q5. The controller U4 should permit only one of it's outputs to be pulled down at one time. This can be done, e.g., with a decoder or with NAND gates. The inputs of controller U4 can either be encoded, or the controller U4 could have one input line for each gate voltage. Preferably, only one voltage source B1 is used for mimicking the laser diode, to minimize offset errors between the various control circuits. In other words, the various laser diode mimic circuits (of the different gate voltage circuits $1410_n$) should share the same voltage source B1. A separate pair of control currents ($I_{control\_n}$) is used to establish the gate voltage of each gate voltage circuit $1410_n$. The functioning of the circuit of FIG. 14 is similar to that of FIG. 13A, except for the multiple gate voltage circuits $1410_n$. The circuit topology of FIG. 14A will allow for a minimum sized output device Q2, fast speed, low headroom voltage, and high efficiency.

Figure 14B:
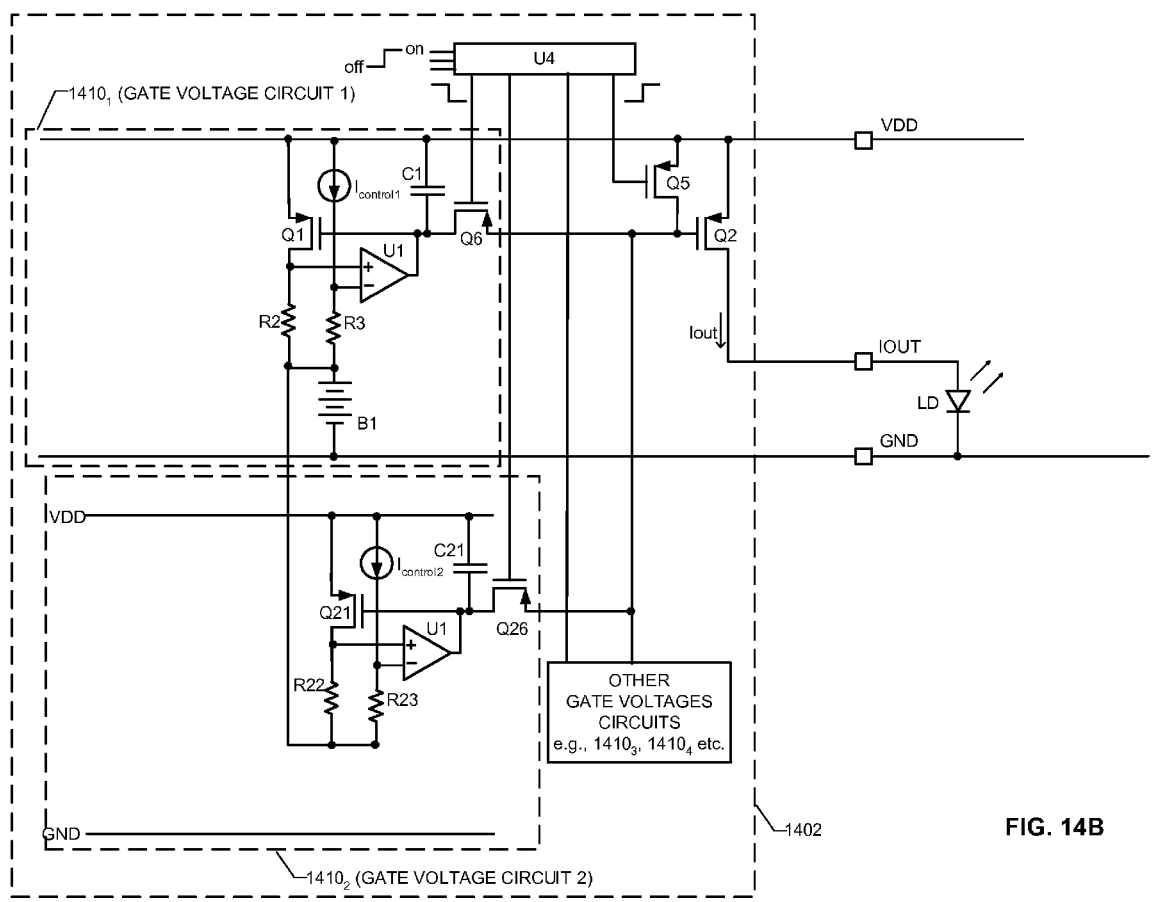
FIG. 14B is a circuit diagram including a multiple set point switched gate current driver, according to an embodiment of the present invention.

FIG. 14B is similar to the circuit of FIG. 14A, except that certain transistors (e.g., Q7 and Q27), resistors (e.g., R1 and R21) and op-amps (e.g., U3 and U23) are eliminated, as are certain current sources. This results a simpler, smaller and less expensive gate voltage circuits $1410_n'$, and thus also a simpler, smaller and less expensive resistive mode switched gate current driver 1402'.

The circuit configurations of FIGS. 14A and 14B are especially useful with the high power DVD applications that need to operate with a low headroom voltage, high current and fast speed. However, the circuits of FIGS. 14A and 14B would also be useful for driving other types of lasers or resistive or inductive loads where a small, fast, efficient driver is desired. (For an inductive load, the various R1, R21, etc., would be zero ohms.) The output becomes less predictable where the IOUT voltage can vary for reasons other than the application of IOUT. Accordingly, it is desired that the laser diode mimic circuit (e.g., including voltage source B1 and a series resistance) is proportional to the actual load being driven. This can be done by leaving a terminal on an integrated circuit where a custom laser diode mimic circuit can be added (thus leaving the circuit to the user), or by having a fixed mimic circuit (and relying on the user to be sure the load matches it), or by having programmable voltages for B1, and programmable resistors for R1, R21, etc, and relying on the user to perform the proper calibration. One way to allow for programmability of B1 and R1 (etc) is to add an IOUT voltage sampler circuit. With the IOUT voltage sampler circuit, the user could first input a small control current with a small R1 (etc.), and read back the IOUT voltage. Then the value for B1 can be set to the measured voltage. Then a large control current can be set and the value for R1 (etc.) can be increased until the sampled IOUT voltage or the measured laser power has a larger full-scale amount. It might also be desirable to repeat the calibration to get the most accurate results.

The current drivers in FIG. 12-14 are shown as including PMOS devices. However, one of ordinary skill in the art would appreciate that the PMOS devices can be replaced with NMOS devices so long as the devices are connected appropriately between the voltage rails.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. It is intended that the scope of the invention be defined by the following claims and their equivalents.

What is claimed is:

1. A current driver circuit for driving a load (LD), comprising:
   first and second transistors (Q1) and (Q2) that function as a current mirror when gates of the first and second transistors (Q1) and (Q2) are selectively connected together, with a drain of the first transistor (Q1) forming an input of the current mirror, a drain of the second transistor (Q2) forming an output of the current mirror, and the drain of the second transistor (Q2) also forming the output of the current driver circuit;
   a current source (Icontrol) the provides a control current;
   a load mimic circuit (1308) through which the control current flows, and that provides a voltage approximately equal the voltage at the output of the current driver circuit, when an output current (Iout) provided at the output of the current driver circuit is driving the load (LD);
   a control loop that uses the load mimic circuit (1308) to cause the voltage at the drain of the first transistor (Q1) to approximately equal the voltage at the output of the current driver circuit, when the output current (Iout) provided at the output of the current driver circuit is driving the load (LD); and
   a controller that controls whether or not the gates of the first and second transistors (Q1) and (Q2) are connected together, and that causes the second transistor (Q2) to be turned off when the gates of the first and second transistors (Q1) and (Q2) are not connected together.

2. A current driver circuit for driving a load (LD), comprising:
   first and second transistors (Q1) and (Q2) that function as a current mirror when gates of the first and second transistors (Q1) and (Q2) are selectively connected together, with a drain of the first transistor (Q1) forming an input of the current mirror, a drain of the second transistor (Q2) forming an output of the current mirror, and the drain of the second transistor (Q2) also forming the output of the current driver circuit;
   a current source (Icontrol) the provides a control current;
   a load mimic circuit (1308) through which the control current flows, and that provides a voltage approximately equal the voltage at the output of the current driver circuit, when an output current (Iout) provided at the output of the current driver circuit is driving the load (LD); and
   a control loop that uses the load mimic circuit (1308) to cause the voltage at the drain of the first transistor (Q1) to approximately equal the voltage at the output of the current driver circuit, when the output current (Iout) provided at the output of the current driver circuit is driving the load (LD);
   wherein each transistor includes a channel length and a channel width;
   wherein the channel lengths of the first and second transistors (Q1) and (Q2) are substantially the same; and
   wherein the channel width of the first transistor (Q1) is less than the channel width of the second transistor (Q2), thereby resulting in a source-drain current of the first transistor (Q1) being less than a source drain current of the second transistor (Q2).

3. A current driver circuit for driving a load (LD) connected between an output of the current driver circuit and a first voltage rail, comprising:
   a first transistor (Q1) and a second transistor (Q2) each having a gate, a drain and a source, the sources of the first and second transistors (Q1) and (Q2) connected to a second voltage rail, and the drain of the second transistor (Q2) forming the output of the current driver circuit, wherein the first and second transistors (Q1) and (Q2) function as a current mirror when the gates of the first and second transistors (Q1) and (Q2) are selectively connected together;
   a controller that controls whether or not the gates of the first and second transistors (Q1) and (Q2) are connected together, and that causes the second transistor (Q2) to be turned off when the gates of the first and second transistors (Q1) and (Q2) are not connected together;
   a current source (Icontrol) and a load mimic circuit (1308) connected in series between the first voltage rail and the second voltage rail; and
   an op-amp (U) including first and second inputs and an output;
   wherein the load mimic circuit (1308) includes a first terminal, a second terminal, and a voltage source (B1) connected in series with a resistor (R) between the first and second terminals;
   wherein a current provided by the current source (Icontrol), which flows through the load mimic circuit, causes a voltage between the first and second terminals of the load mimic circuit (1308) to approximately equal the voltage at the output of the current driver circuit, when an output current (Iout) of the current driver circuit is driving the load (LD); and
   wherein the op-amp (U) and the load mimic circuit (1308) are configured to cause the voltage at the drain of the transistor (Q1) to approximately equal the voltage at the output of the current driver circuit, when the output current (Iout) provided at the output of the current driver circuit is driving the load (LD).

4. A current driver circuit for driving a load (LD) connected between an output of the current driver circuit and a first voltage rail, comprising:
   a first transistor (Q1) and a second transistor (Q2) each having a gate, a drain and a source, the sources of the first and second transistors (Q1) and (Q2) connected to a second voltage rail, and the drain of the second transistor (Q2) forming the output of the current driver circuit, wherein the first and second transistors (Q1) and (Q2) function as a current mirror when the gates of the first and second transistors (Q1) and (Q2) are selectively connected together;
   a current source (Icontrol) and a load mimic circuit (1308) connected in series between the first voltage rail and the second voltage rail; and
   an op-amp (U) including first and second inputs and an output;
   wherein the load mimic circuit (1308) includes a first terminal, a second terminal, and a voltage source (B1) connected in series with a resistor (R) between the first and second terminals;

wherein a current provided by the current source (Icontrol), which flows through the load mimic circuit, causes a voltage between the first and second terminals of the load mimic circuit (1308) to approximately equal the voltage at the output of the current driver circuit, when an output current (Iout) of the current driver circuit is driving the load (LD); and wherein the op-amp (U) and the load mimic circuit (1308) are configured to cause the voltage at the drain of the transistor (Q1) to approximately equal the voltage at the output of the current driver circuit, when the output current (Iout) provided at the output of the current driver circuit is driving the load (LD);

wherein one of the inputs of the op-amp (U) is connected to a node between the current source (Icontrol) and the load mimic circuit (1308), so that a voltage at the one of the inputs of the op-amp (U) is substantially equal to the voltage across the load (LD);

wherein the other input of the op-amp (U) is connected to the drain of the first transistor (Q1); and wherein the output of the op-amp (U) is connected to the gate of the first transistor (Q1).

5. The current driver circuit of claim 4, further comprising:

a second resistor (R2) connected between one of the inputs of the op-amp (U) and a node between the voltage source (B1) and the resistor (R) of the load mimic circuit (1308).

6. The current driver circuit of claim 3, wherein:

each transistor includes a channel length and a channel width;

the channel lengths of the first and second transistors (Q1) and (Q2) are substantially the same;

the channel width of the first transistor (Q1) is less than the channel width of the second transistor (Q2), thereby resulting in a source-drain current of the first transistor (Q1) being less than a source drain current of the second transistor (Q2).

7. A current driver circuit for driving a load (LD) connected between an output of the current driver circuit and a first voltage rail, comprising:

a first transistor (Q1) and a second transistor (Q2) each having a gate, a drain and a source, the sources of the first and second transistors (Q1) and (Q2) connected to a second voltage rail, and the drain of the second transistor (Q2) forming the output of the current driver circuit, wherein the first and second transistors (Q1) and (Q2) function as a current mirror when the gates of the first and second transistors (Q1) and (Q2) are selectively connected together;

a third transistor (Q6) that selectively connects the gates of the first and second transistors (Q1) and (Q2) together; and a fourth transistor (Q5) that selectively connects the gate of the second transistor (Q2) to the second voltage rail when the third transistor (Q6) is not connecting the gates of the first and second transistors (Q1) and (Q2) together;

a current source (Icontrol) and a load mimic circuit (1308) connected in series between the first voltage rail and the second voltage rail; and an op-amp (U) including first and second inputs and an output;

wherein the load mimic circuit (1308) includes a first terminal, a second terminal, and a voltage source (B1) connected in series with a resistor (R) between the first and second terminals;

wherein a current provided by the current source (Icontrol), which flows through the load mimic circuit, causes a voltage between the first and second terminals of the load mimic circuit (1308) to approximately equal the voltage at the output of the current driver circuit, when an output current (Iout) of the current driver circuit is driving the load (LD); and wherein the op-amp (U) and the load mimic circuit (1308) are configured to cause the voltage at the drain of the transistor (Q1) to approximately equal the voltage at the output of the current driver circuit, when the output current (Iout) provided at the output of the current driver circuit is driving the load (LD).

8. The current driver circuit of claim 7, wherein:

the first transistor (Q1), the third transistor (Q6), the current source (Icontrol), the op-amp (U), the second resistor (R2) and the load mimic circuit (1308) make up a first gate voltage circuit that selectively provides a first voltage to the gate of the second transistor (Q2); and the current driver circuit outputs a first current when the first voltage is provided to the gate of the second transistor (Q2).

9. The current driver circuit of claim 8, further comprising:

a second gate voltage circuit that selectively provides a second voltage to the gate of the second transistor (Q2), where the second voltage is different than the first voltage;

wherein the current driver circuit outputs a second current when the second voltage is provided to the gate of the second transistor (Q2), wherein the second current is different than the first current.

10. The current driver circuit of claim 9, wherein the first and second gate voltage circuits share at least a portion of the same load mimic circuit (1308).

11. The current driver circuit of claim 9, wherein the first and second gate voltage circuits share the same voltage source (B1).

12. The current driver circuit of claim 3, wherein the first voltage rail is ground.

13. A current driver circuit for driving a load (LD), comprising:

a transistor (Q2) having a gate, a drain and a source, with the drain of the transistor (Q2) forming the output of the current driver circuit; and a plurality of gate voltage circuits, each of which selectively provides a different voltage to the gate of the transistor (Q2);

wherein a magnitude of an output current produced at the output of the current driver circuit is dependent upon which of the plurality of gate voltage circuits is selected;

wherein each gate voltage circuit includes a further transistor, a current source, an op-amp, a resistor and a load mimic circuit (1308);

wherein when one of the gate voltage circuits is selected, the further transistor of the selected gate voltage circuit functions together with the transistor (Q2) as a current mirror; and wherein the magnitude of the output current produced at the output of the selected current driver circuit is dependent at least in part upon a channel width of the further transistor and the current source of the selected gate voltage circuit.

14. The current driver circuit of claim 13, wherein each gate voltage circuit includes another transistor that selectively connects the gate of the transistor (Q2) to the gate of the further transistor of the selected one of the gate voltage circuits.

15. The current driver circuit of claim 14, wherein the another transistor of each gate voltage circuit has a source-drain path connected between the gate of the transistor (Q2) and the gate of the further transistor, wherein one of the gate voltage circuits is selected by turning on the another transistor of the gate voltage circuit.

16. The current driver circuit of claim 13, wherein the load mimic circuit includes a voltage source in series with a further resistor.

17. A method for driving a load (LD), comprising:
   providing a transistor (Q2) having a gate, a drain and a source, with the drain of the transistor (Q2) forming the output of a current driver circuit; and
   providing a plurality of gate voltage circuits,
      wherein each gate voltage circuit selectively provides a different voltage to the gate of the transistor (Q2), and
      wherein each gate voltage circuit includes a further transistor that, when the gate voltage circuit is selected, functions together with the transistor (Q2) as a current mirror; and
   selecting one the gate voltage circuits at a time; and
   using a load mimic circuit and an op-amp to cause a voltage at the drain of the further transistor, of the selected gate voltage circuit, to substantially equal a voltage at the output of the current driver circuit;
   wherein a magnitude of an output current produced at the output of the current driver circuit is dependent upon which of the gate voltage circuits is selected.

18. The method of claim 17, wherein each gate voltage circuit includes another transistor that selectively connects the gate of the transistor (Q2) to the gate of the further transistor of the selected one of the gate voltage circuits.

19. The method of claim 18, wherein the another transistor of each gate voltage circuit has a source-drain path connected between the gate of the transistor (Q2) and the gate of the further transistor, wherein one of the gate voltage circuits is selected by turning on the another transistor of the gate voltage circuit.

20. The method of claim 17, further comprising:
   changing which gate voltage circuit is selected in response to a control signal.

21. The current driver circuit of claim 7, further comprising:
   a controller that controls whether or not the third transistor (Q6) connects the gates of the first and second transistors (Q1) and (Q2) together, and that causes the fourth transistor (Q5) to connect the gate of the second transistor (Q2) to the second voltage rail when the gates of the first and second transistors (Q1) and (Q2) are not connected together.

* * * * *